(12) United States Patent
Kim

(10) Patent No.: US 8,216,900 B2
(45) Date of Patent: Jul. 10, 2012

(54) NONVOLATILE MEMORY DEVICE, METHOD OF MANUFACTURING THE NONVOLATILE MEMORY DEVICE, AND METHOD OF MANUFACTURING FLAT PANEL DISPLAY DEVICE PROVIDED WITH THE NONVOLATILE MEMORY DEVICE

(75) Inventor: Dae Young Kim, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 508 days.

(21) Appl. No.: 12/471,967

(22) Filed: May 26, 2009

(65) Prior Publication Data
US 2009/0294834 A1    Dec. 3, 2009

(30) Foreign Application Priority Data
May 29, 2008 (KR) .................. 10-2008-0050369

(51) Int. Cl.
*H01L 21/8247* (2006.01)
*H01L 21/3065* (2006.01)

(52) U.S. Cl. ........ 438/261; 438/287; 438/486; 438/591; 438/697; 438/777; 257/E21.218; 257/E21.679

(58) Field of Classification Search .................. 438/261, 438/287, 486, 591, 697, 777; 257/E21.218, 257/E21.679
See application file for complete search history.

(56) References Cited

U.S. PATENT DOCUMENTS
7,501,682 B2 * 3/2009 Choi et al. .................... 438/257

FOREIGN PATENT DOCUMENTS
KR    2002002904 A  *  1/2002
KR    10-0719680 B1    5/2007

* cited by examiner

*Primary Examiner* — Zandra Smith
*Assistant Examiner* — Toniae Thomas
(74) *Attorney, Agent, or Firm* — Saliswanchik, Lloyd & Eisenschenk

(57) ABSTRACT

Provided are a nonvolatile memory device, a method of manufacturing the nonvolatile memory device, and a method of manufacturing a flat panel display device provided therein with the nonvolatile memory device. According to an embodiment, an amorphous silicon layer is formed on a substrate, and then annealed by using an Excimer laser to form a crystallized silicon layer. A nitrogen plasma treatment is performed for the crystallized silicon layer to planarize an upper surface of the crystallized silicon layer. An ONO layer is formed on the nitrogen plasma-treated crystallized silicon layer. A metal layer is formed on the ONO layer. The metal layer, the ONO layer and the nitrogen plasma-treated crystallized silicon layer are patterned.

14 Claims, 3 Drawing Sheets

NONVOLATILE MEMORY DEVICE, METHOD OF MANUFACTURING THE NONVOLATILE MEMORY DEVICE, AND METHOD OF MANUFACTURING FLAT PANEL DISPLAY DEVICE PROVIDED WITH THE NONVOLATILE MEMORY DEVICE

CROSS-REFERENCE TO RELATED APPLICATION

This application claims the benefit under 35 U.S.C. §119 of Korean Patent Application No. 10-2008-0050369, filed May 29, 2008, which is hereby incorporated by reference in its entirety.

BACKGROUND

A flash memory that is widely used as a nonvolatile memory is the electrically erasable programmable read only memory (EEPROM). Such a flash memory can program and erase data electrically.

That is, in a program operation, a threshold voltage of a cell transistor is elevated by forming hot electrons in a drain and accumulating the hot electrons in a floating gate.

In an erase operation, the threshold voltage of the cell transistor is lowered by generating a high voltage between a source and the floating gate through the F-N (Fowler-Nordheim) tunneling and thus emitting the electrons accumulated in the floating gate.

Meanwhile, to achieve high integration of memory semiconductor devices, research and development for decreasing the area of the cell transistor and accomplishing a low operation voltage have been actively performed. Flash memories increase static capacitances by using NO (nitride-oxide), ONO (oxide-nitride-oxide) or other high dielectrics as an intergate dielectric layer instead of silicon dioxide ($SiO_2$).

In a process of manufacturing a cell transistor of a flash memory using an intergate dielectric layer of an ONO structure, the ONO structure is generally formed by growing a dielectric layer on a polycrystalline silicon (hereinafter, referred to as 'polysilicon') layer used as a floating gate through a high temperature thermal oxidation.

Then, to form the polysilicon layer used as the floating gate, a deposition process should be performed at a high temperature.

In the case where such a flash memory device is formed inside a flat panel display device, such a high temperature deposition process may cause a problem.

Research on nonvolatile semiconductor memory (NVSM) devices, which are applicable to flat panel display devices requiring low power consumption, have been actively performed in recent years.

A flat panel display device includes a transparent glass substrate, a thin film transistor (TFT) array and various driving elements, and displays an image on the transparent glass substrate by manipulating the above elements.

In the case where a process for forming a high temperature polysilicon layer is performed on the transparent glass substrate, the glass substrate may be melted and can fail.

To solve the above problem, an amorphous silicon layer is formed on the glass substrate by a low temperature deposition process and is then crystallized by an Excimer laser annealing process. However, the crystallized polycrystalline silicon layer has an irregular upper surface.

When a tunnel oxide layer is formed on the irregular polycrystalline silicon layer, the tunnel oxide also has an irregular upper surface and a bad layer quality, which deteriorate a program characteristic of the NVSM device.

BRIEF SUMMARY

Embodiments relate to a nonvolatile memory device, a method of manufacturing the same, and a method of manufacturing a flat panel display device provided therein with the nonvolatile memory device.

In one embodiment, a nonvolatile memory device comprises: a buffer layer on a substrate; a crystallized silicon layer on the buffer layer; a silicon nitride layer on the crystallized silicon layer; an ONO layer including a charge trap layer on the silicon nitride layer; and a gate electrode on the ONO layer.

In another embodiment, a method of manufacturing a nonvolatile memory device comprises: forming an amorphous silicon layer on a substrate; annealing the amorphous silicon layer by using an Excimer laser to form a crystallized silicon layer; performing a nitrogen plasma treatment for the crystallized silicon layer to planarize an upper surface of the crystallized silicon layer; forming an ONO layer on the nitrogen plasma-treated crystallized silicon layer; forming a metal layer on the ONO layer; and patterning the metal layer, the ONO layer and the crystallized silicon layer.

In yet another embodiment, a method of manufacturing a flat panel display device provided therein with a nonvolatile memory device comprises: forming a buffer layer on a glass substrate; forming an amorphous silicon layer on the buffer layer; annealing the amorphous silicon layer by using an Excimer laser to form a crystallized silicon layer; performing a nitrogen plasma treatment for the crystallized silicon layer to planarize an upper surface of the crystallized silicon layer; forming an ONO layer on the nitrogen plasma-treated crystallized silicon layer; forming a metal layer on the ONO layer; and patterning the metal layer, the ONO layer and the crystallized silicon layer.

According to embodiments, since the tunnel oxide layer of the nonvolatile memory device is formed with a uniform thickness, the nonvolatile memory device shows enhanced program characteristics.

According to embodiments, since the nonvolatile memory device can be formed on a glass substrate at a low temperature, the process stability is enhanced and yield is also improved.

The details of one or more embodiments are set forth in the accompanying drawings and the description below. Other features will be apparent from the description and drawings, and from the claims.

DETAILED DESCRIPTION

Figure 1:
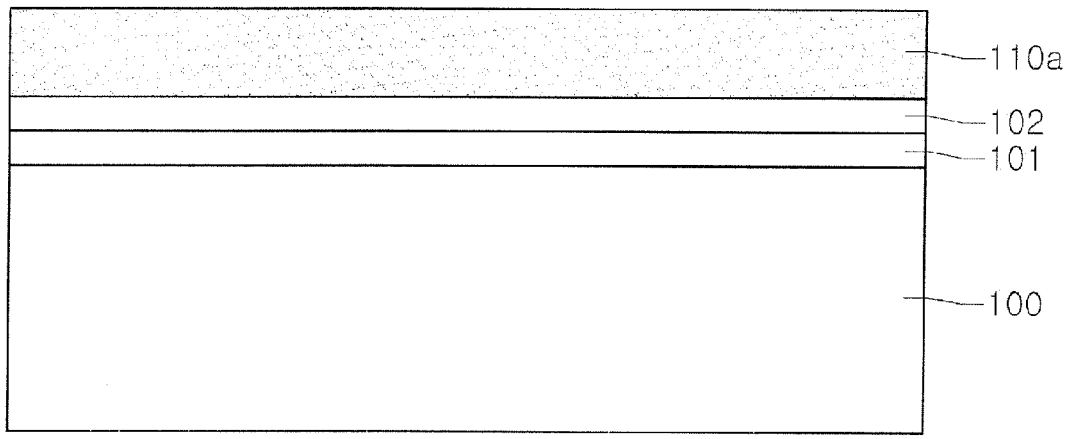
FIGS. 1 to 6 are sectional views illustrating a method of manufacturing a semiconductor device according to an embodiment.

A nonvolatile memory device according to an embodiment will be described in detail with reference to the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through adding, altering, and changing, and will fully convey the concept of the invention to those skilled in the art.

In addition, the terms "first" and "second" can be selectively or exchangeably used for the members. In the figures, dimensions of elements may be exaggerated for clarity of illustration, and the dimension of each of the elements may be different from an actual dimension of each of the elements. Not all elements illustrated in the drawings must be included and limited to the present disclosure. Rather, the elements except essential features of the present disclosure may be added or deleted. Also, in the descriptions of embodiments, it will be understood that when a layer (or film), a region, a pattern, or a structure is referred to as being "on/above/over/upper" a substrate, layer (or film), region, pad, patterns, it can be directly on the substrate, layer (or film), region, pad, or patterns, or intervening layers may also be present. Further, it will be understood that when a layer is referred to as being "under/below/lower" another element, it can be directly under the other element, or one or more intervening layers may also be present. Therefore, meaning thereof should be judged according to the spirit of the present disclosure.

FIGS. 1 to 6 are sectional views illustrating a method of manufacturing a nonvolatile memory device according to an embodiment.

As shown in FIG. 1, a first buffer layer 101 and a second buffer layer 102 can be sequentially deposited on a glass substrate 100.

The first buffer layer 101 may be a silicon nitride (SiN) layer.

The first buffer layer 101 may have a thickness range of 10-1000 Å.

The second buffer layer 102 may be a silicon oxide (SiOx) layer, for example silicon dioxide ($SiO_2$).

The second buffer layer 102 may have a thickness range of 10-1000 Å.

Next, an amorphous silicon (a-Si) layer 110a is formed on the second buffer layer 102.

The a-Si layer 110a is formed at a low temperature equal to or less than 500° C. by a plasma enhanced chemical vapor deposition (PECVD).

The a-Si layer 110a may be formed in a thickness range of 500-3000 Å.

Figure 2:
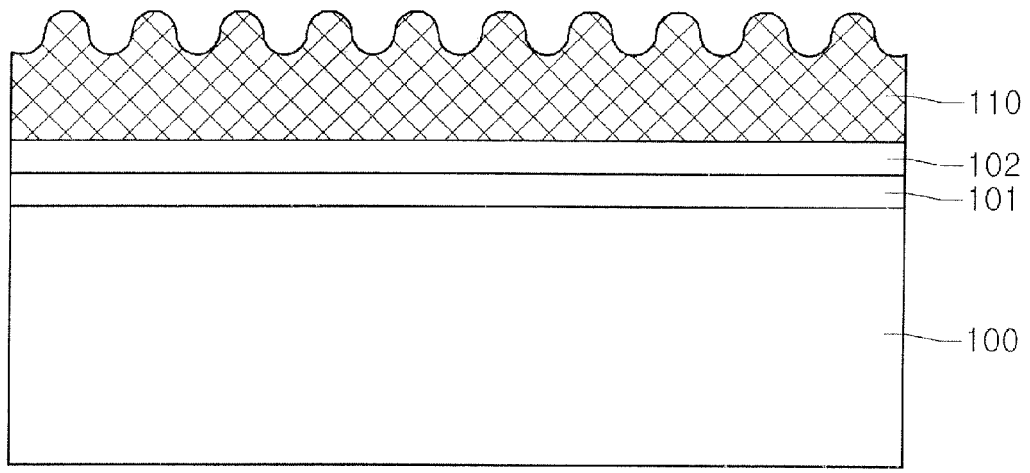

As shown in FIG. 2, the a-Si layer 110a can be crystallized by using Excimer Laser Annealing (ELA).

Hereinafter, the crystallized a-Si layer 110a is referred to as 'polysilicon layer 110".

The polysilicon layer 110 has an irregular upper surface while being crystallized by ELA.

The polysilicon layer 110 may also be doped with impurity ions.

Figure 3:
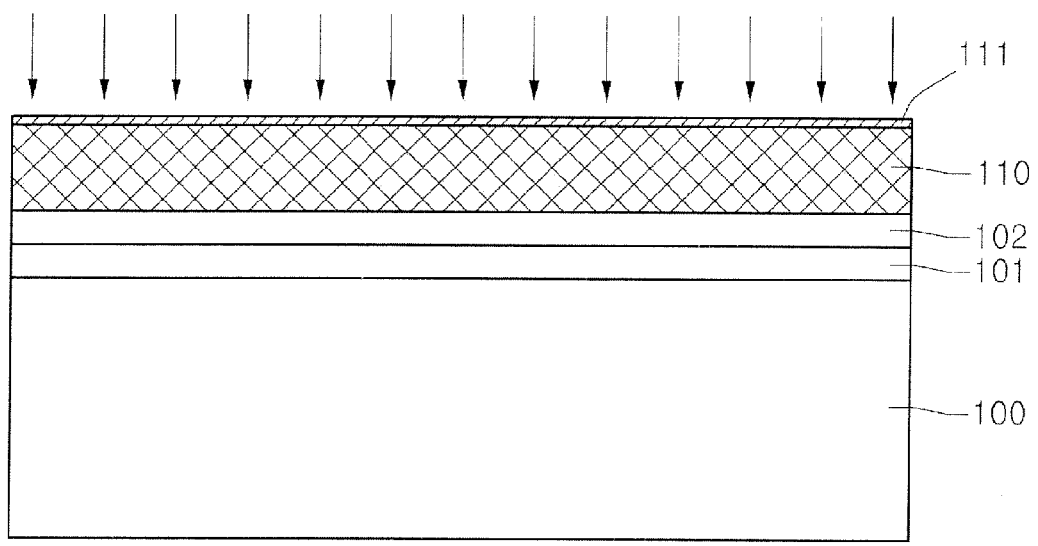
Figure 4:
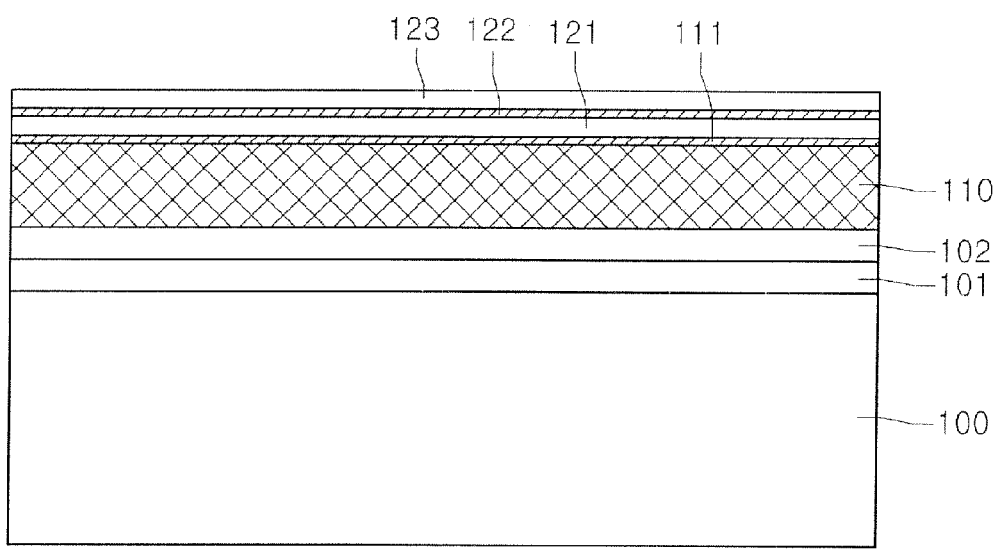

As shown in FIG. 3, the irregular upper surface of the polysilicon layer 110 is planarized through a nitrogen plasma treatment.

In the nitrogen plasma treatment, nitrogen plasma with a predetermined energy collides with the polysilicon layer 110. By doing so, the irregular upper surface of the polysilicon layer 110 is abraded by physical collision with the nitrogen plasma, and is thereby planarized.

The nitrogen plasma treatment process may be performed under the conditions of 200 W to 1550 W RF energy, 100 sccm to 800 sccm nitrogen dose and 10 mtorr to 20 mtorr chamber pressure.

In the nitrogen plasma treatment process, the irregular upper surface of the polysilicon layer 110 is abraded and planarized, and is also nitrided to form a thin silicon nitride layer 111.

The thickness of the silicon nitride layer 111 may vary with a time of the nitrogen plasma treatment process, etc.

The silicon nitride layer 111 is formed by a bonding between nitrogen plasma and silicon atoms of the polysilicon layer, not by a deposition using silane gas.

Thereafter, a first dielectric layer 121 is formed on the polysilicon layer 110 having the silicon nitride layer 111 thereon.

The first dielectric layer 121 may be deposited by using a PECVD, and can be a silicon oxide layer. The first dielectric layer 121 can have a thickness range of 60 Å to 120 Å.

The first dielectric layer 121 can be formed with a uniform thickness because the polysilicon layer 110 has a uniform surface.

The first dielectric layer 121 may act as a tunnel oxide layer in program and erase operations of a nonvolatile memory device.

Next, a second dielectric layer 122 and a third dielectric layer 123 are sequentially formed on the first dielectric layer 121.

The second dielectric layer 122 can be a silicon nitride layer, and may act as a layer programmed by trapping a charge in a nonvolatile memory device.

The third dielectric layer 123 can be a silicon oxide layer.

The first to third dielectric layers 121, 122 and 123 may be formed as a dielectric layer such as an ONO layer.

The first dielectric layer 121 may be a tunneling oxide layer through which a charge passes from the crystallized silicon layer.

The second dielectric layer 122 may be a nitride layer, which traps the charge.

The third dielectric layer 123 may be a blocking oxide layer, which isolates a gate electrode from the nitride layer.

Figure 5:
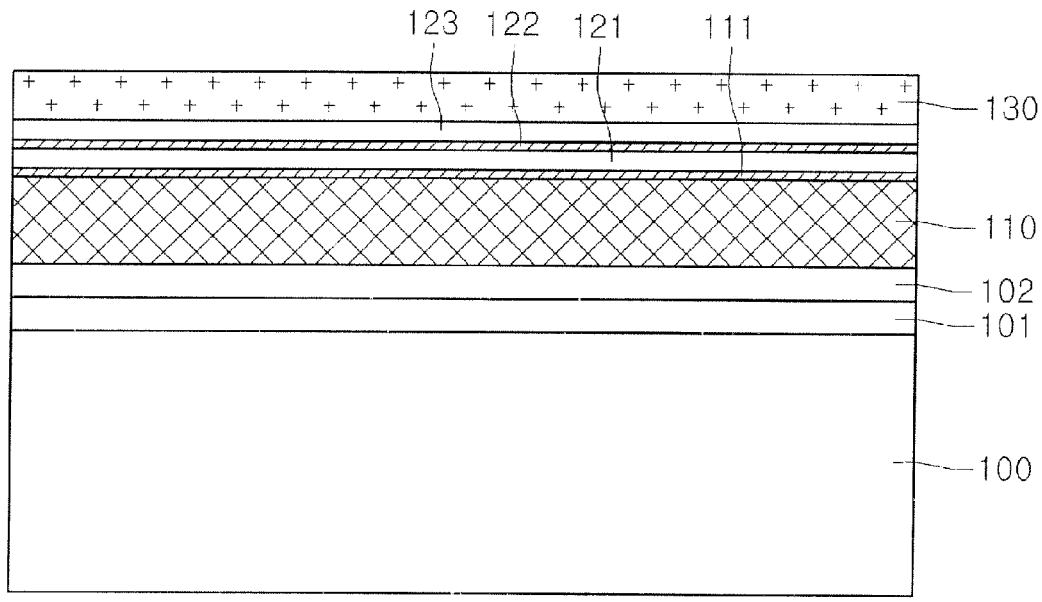

Thereafter, as shown in FIG. 5, a gate layer 130 is formed on the third dielectric layer 123.

The gate layer 130 may be a polysilicon layer or a metal layer. According to this embodiment, a metal layer is formed on the third dielectric layer 123. The material for the gate layer 130 may be particularly selected because the deposition of the gate layer 130 should be performed under a low temperature condition in consideration of the characteristics of the glass substrate.

The metal layer may include at least one selected from the group consisting of aluminum (Al), molybdenum (Mo), titanium (Ti), tantalum (Ta) and copper (Cu), but other metals may be employed if they have a good conductivity.

Figure 6:
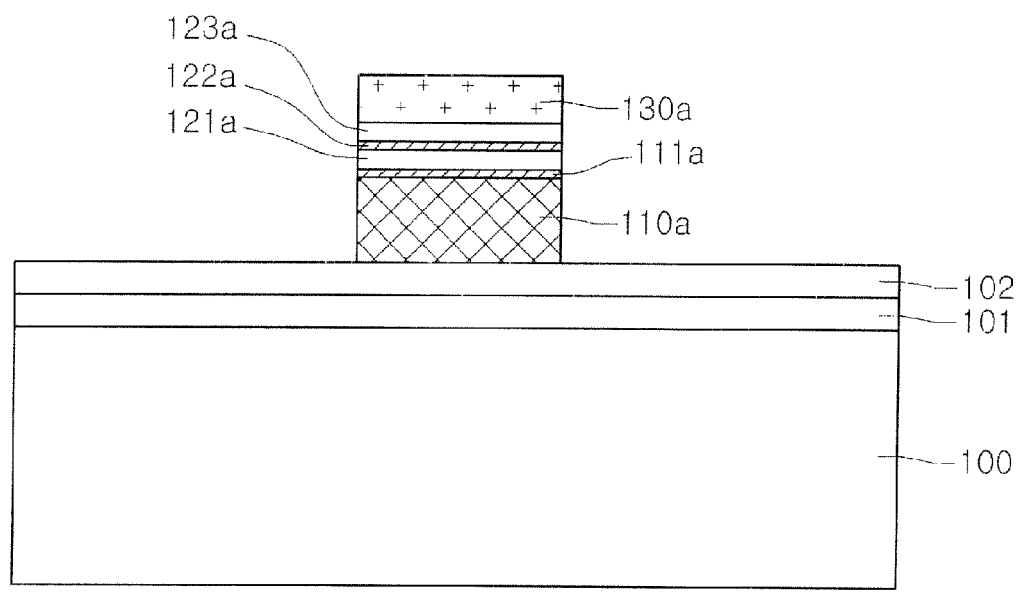

Next, referring to FIG. 6, the gate layer 130, the third dielectric layer 123, the second dielectric layer 122 and the first dielectric layer 121 are patterned to form a gate pattern for a nonvolatile memory device.

The gate pattern may include a polysilicon pattern 110a on the first and second buffer layers 101 and 102, a silicon nitride pattern 111a, first to third dielectric patterns 121a, 122a and 123a, and a gate electrode 130a.

Accordingly, this embodiment can provide the polysilicon layer with a uniform thickness while a nonvolatile memory device is formed on a glass substrate, and also provide the tunnel oxide layer on the polysilicon layer with a uniform thickness.

Since the uniform thickness of each of the polysilicon layer and the tunnel oxide layer is an important factor that can determine the characteristics of nonvolatile memory devices, embodiments of the present invention make it possible to manufacture a nonvolatile memory device with good quality.

Also, the silicon nitride layer, which is a byproduct formed by the nitrogen plasma treatment of the polysilicon layer, can act as a tunnel oxide layer together with the first dielectric layer. Since the silicon nitride layer has a higher permittivity than the silicon oxide layer, the tunnel oxide layer can further enhance the programmability.

Nonvolatile memory devices fabricated in accordance with embodiments of the present invention can be built in a flat panel display device.

According to embodiments, since the tunnel oxide layer of the nonvolatile memory device is formed with a uniform thickness, the nonvolatile memory device shows enhanced program characteristics.

According to embodiments, since the nonvolatile memory device can be formed on a glass substrate at a low temperature, the process stability is enhanced and yield is also improved.

According to an embodiment, since the nonvolatile memory device can be formed on a glass substrate, which requires a low temperature process, the nonvolatile memory device can be built in a flat panel display device, such as a liquid crystal display device, etc., and thus low power consumption can be realized.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a nonvolatile memory device, the method comprising:
    forming an amorphous silicon layer on a substrate;
    annealing the amorphous silicon layer by using an Excimer laser to form a crystallized silicon layer;
    performing a nitrogen plasma treatment for the crystallized silicon layer to planarize an upper surface of the crystallized silicon layer;
    forming an ONO layer on the nitrogen plasma-treated crystallized silicon layer;
    forming a metal layer on the ONO layer; and
    patterning the metal layer, the ONO layer and the nitrogen plasma-treated crystallized silicon layer.

2. The method of claim 1, prior to the forming of the amorphous silicon layer, further comprising forming a buffer layer on the substrate.

3. The method of claim 2, wherein the forming of the buffer layer comprises:
    forming a buffer silicon nitride layer on the substrate; and
    forming a buffer silicon oxide layer on the buffer silicon nitride layer.

4. The method of claim 3, wherein the buffer silicon nitride layer has a thickness range of 10-1000 Å, and the buffer silicon oxide layer has a thickness in the range of 10-1000 Å.

5. The method of claim 1, wherein the nitrogen plasma treatment is performed under the conditions of 200 W to 1550 W RF energy, 100 sccm to 800 sccm nitrogen dose and 10 mtorr to 20 mtorr chamber pressure.

6. The method of claim 1, wherein the amorphous silicon layer has a thickness in the range of 500-3000 Å.

7. The method of claim 1, wherein performing the nitrogen plasma treatment forms a silicon nitride layer on the crystallized silicon layer.

8. The method of claim 1, wherein performing the nitrogen plasma treatment forms a silicon nitride layer on the crystallized silicon layer, wherein the ONO layer is formed on the silicon nitride layer.

9. The method of claim 1, wherein the amorphous silicon layer and the ONO layer are formed by using PECVD.

10. The method of claim 1, wherein the substrate is a glass substrate.

11. A method of manufacturing a flat panel display device provided therein with a nonvolatile memory device, the method comprising:
    forming a buffer layer on a glass substrate;
    forming an amorphous silicon layer on the buffer layer;
    annealing the amorphous silicon layer by using an Excimer laser to form a crystallized silicon layer;
    performing a nitrogen plasma treatment for the crystallized silicon layer to planarize an upper surface of the crystallized silicon layer;
    forming an ONO layer on the nitrogen plasma-treated crystallized silicon layer;
    forming a metal layer on the ONO layer; and
    patterning the metal layer, the ONO layer and the nitrogen plasma-treated crystallized silicon layer.

12. The method of claim 11, wherein a silicon nitride layer is formed on the crystallized silicon layer by the nitrogen plasma treatment.

13. The method of claim 11, wherein the nitrogen plasma treatment is performed under the conditions of 200 W to 1550 W RF energy, 100 sccm to 800 sccm nitrogen dose and 10 mtorr to 20 mtorr chamber pressure.

14. The method of claim 11, wherein the amorphous silicon layer is formed at a low temperature equal to or less than 500° C. by using PECVD.

* * * * *